US008736363B2

(12) United States Patent
Bhattacharyya et al.

(10) Patent No.: US 8,736,363 B2
(45) Date of Patent: May 27, 2014

(54) CIRCUIT FOR OPTIMIZING A POWER MANAGEMENT SYSTEM DURING VARYING LOAD CONDITIONS

(75) Inventors: Prasun Kali Bhattacharyya, Bangalore (IN); Sumanth Chakkirala, Bangalore (IN)

(73) Assignee: Cadence AMS Design India Private Limited, Kamataka (IN)

( * ) Notice: Subject to any disclaimer, the term of this patent is extended or adjusted under 35 U.S.C. 154(b) by 0 days.

(21) Appl. No.: 13/009,869

(22) Filed: Jan. 20, 2011

(65) Prior Publication Data

US 2013/0021094 A1    Jan. 24, 2013

(30) Foreign Application Priority Data

Sep. 13, 2010   (IN) .............................. 2653/CHE/2010

(51) Int. Cl.
 *H03F 1/14*   (2006.01)
 *H03F 3/68*   (2006.01)
(52) U.S. Cl.
 USPC ......................................... 330/51; 330/124 R
(58) Field of Classification Search
 USPC ................. 330/51, 124 R, 295, 297
 See application file for complete search history.

(56) References Cited

U.S. PATENT DOCUMENTS

| | | | | |
|---|---|---|---|---|
| 5,548,246 A | * | 8/1996 | Yamamoto et al. | 330/51 |
| 6,300,828 B1 | * | 10/2001 | McInnis | 330/124 R |
| 6,501,252 B2 | * | 12/2002 | Fujise | 323/280 |
| 7,053,676 B2 | * | 5/2006 | Kranz | 327/108 |
| 7,064,531 B1 | * | 6/2006 | Zinn | 323/282 |
| 7,190,150 B2 | * | 3/2007 | Chen et al. | 323/283 |
| 7,298,122 B2 | * | 11/2007 | Bernacchia et al. | 323/282 |
| 7,436,159 B1 | * | 10/2008 | Wochele | 323/282 |
| 7,531,996 B2 | * | 5/2009 | Yang et al. | 323/282 |
| 2006/0001485 A1 | * | 1/2006 | Parker et al. | 330/124 R |

\* cited by examiner

*Primary Examiner* — Khanh V Nguyen
(74) *Attorney, Agent, or Firm* — Rosenberg, Klein & Lee

(57) ABSTRACT

A circuit for optimizing a power management system. The circuit includes a first amplifier. The first amplifier is responsive to a first reference signal and operable to supply a first load current. The circuit also includes a second amplifier coupled to the first amplifier. The second amplifier is responsive to a second reference signal and operable to supply a second load current. The second load current is lower in magnitude than the first load current, thereby enabling the first amplifier to operate during a first load condition, and the second amplifier to operate during the first load condition and a second load condition. Further, the circuit includes a resistive element coupled to the first amplifier and the second amplifier, to isolate the first amplifier from the second amplifier.

11 Claims, 2 Drawing Sheets

CIRCUIT FOR OPTIMIZING A POWER MANAGEMENT SYSTEM DURING VARYING LOAD CONDITIONS

TECHNICAL FIELD

Embodiments of the current disclosure described herein provide a circuit for optimizing a power management system during varying load conditions.

BACKGROUND

Power management includes switching off power or switching to a low power state when a system is in an inactive state. One example of the power management is turning off a display of an electronic device if the electronic device is in idle state for a certain period of time. An example of the system can be an integrated circuit for radio frequency applications.

A system for power management includes a voltage regulator. The voltage regulator is a device used for regulating voltage supply. A regulated voltage supply is used to drive a load. In one example, a load can be a resistor. In another example, the load can be an external circuit coupled to the voltage regulator. Often, a system includes varying loads that draws varying load currents from the voltage regulator. In existing techniques, the voltage regulator is used to regulate voltage under varying load currents. However, to stabilize the voltage regulator at varying loads, a high quiescent current is drawn irrespective of whether the system is under a full-load condition or a no-load condition, thereby making the system unreliable. Furthermore, varying loads will vary impedance of the system, thereby making the system unstable.

It is desired to have a voltage regulator that can handle varying loads and function at optimal quiescent current.

SUMMARY

Embodiments of the current disclosure described herein provide a circuit for optimizing a power management system during varying load conditions.

A circuit for optimizing a power management system includes a first amplifier, the first amplifier responsive to a first reference signal and operable to supply a first load current. The circuit also includes a second amplifier coupled to the first amplifier, the second amplifier responsive to a second reference signal and operable to supply a second load current, the second load current being lower in magnitude than the first load current, to enable the first amplifier to operate during a first load condition, and the second amplifier to operate during the first load condition and a second load condition.

A circuit for optimizing a power management system includes a first amplifier, the first amplifier responsive to a first reference signal and operable to supply a first load current. The circuit also includes a second amplifier coupled to the first amplifier, the second amplifier responsive to a second reference signal and operable to supply a second load current, the second load current being lower in magnitude than the first load current, thereby enabling the first amplifier to operate during a first load condition, and the second amplifier to operate during the first load condition and a second load condition. Further, the circuit includes a resistive element coupled to the first amplifier and the second amplifier, to isolate the first amplifier from the second amplifier.

An example of a method for optimizing a power management system during varying load conditions includes sensing a load current at an output terminal. The method includes determining if the load current is exceeding a pre-defined current level. The method also includes operating at least one of a first amplifier and a second amplifier based on the determining.

Other aspects and example embodiments are provided in the figures and the detailed description that follows.

DETAILED DESCRIPTION OF THE EMBODIMENTS

Figure 1:
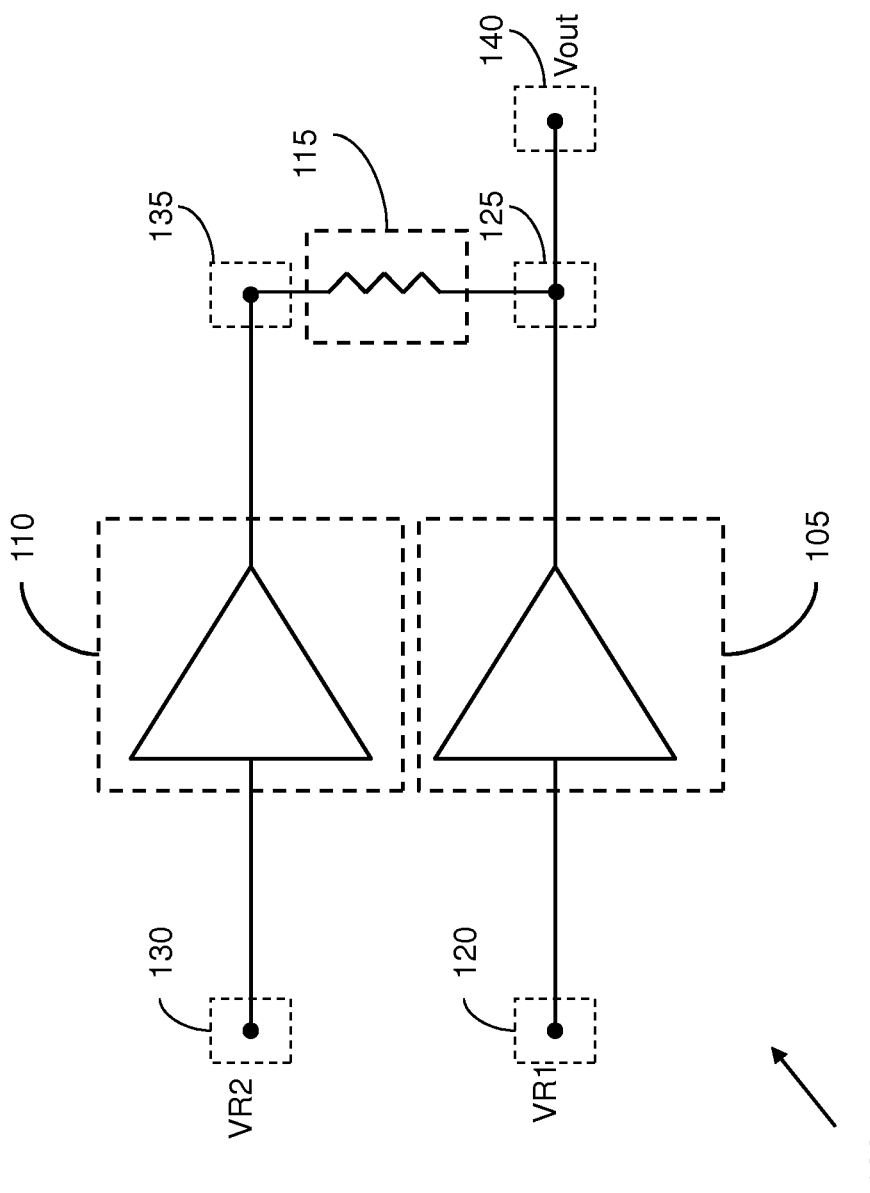
FIG. 1 is a schematic diagram of a circuit for optimizing a power management system, in accordance to one embodiment.

FIG. 1 is a schematic diagram of a circuit 100 for optimizing a power management system in accordance to one embodiment.

The circuit 100 includes a first amplifier 105, a second amplifier 110, and a resistive element 115.

The first amplifier 105 includes an input terminal 120 and an output terminal 125, the input terminal 120 being coupled to a first reference signal (VR1) and the output terminal 125 coupled to one end of the resistive element 115. In one embodiment, the first amplifier 105 can include one or more metal oxide semiconductor (MOS) transistors. The first amplifier 105 is operable at high load current. The first amplifier 105 includes a MOS transistor (not shown in figure) that operates at low current if a load current at the output terminal 125 of the first amplifier 105 is below a threshold. When the output current is less than the threshold, a bias current of the first amplifier 105 is reduced lowering a quiescent current of the first amplifier 105. In another embodiment, the MOS transistor is an output transistor of the first amplifier 105. In some embodiments, the MOS transistor is operable to become inactive if the load current at the output terminal 125 of the first amplifier 105 is below the threshold.

The second amplifier 110 is in parallel to the first amplifier 105. The second amplifier 110 is operable at high load current and low load current. The second amplifier 110 includes an input terminal 130 and an output terminal 135. The input terminal 130 is coupled to a second reference signal (VR2) and the output terminal 135 is coupled to other end of the resistive element 115. The second amplifier 110 is a micropower amplifier. The micropower amplifier requires quiescent current of low magnitude. The magnitude can be in the order of micro amperes.

The first reference signal and the second reference signal can be received from a tracking circuit or as a feedback of the circuit 100.

In some embodiments, the first amplifier 105 and the second amplifier 110 are low-dropout regulators.

The resistive element 115 is coupled between the output terminal 125 of the first amplifier 105 and the output terminal 135 of the second amplifier 110. In one example, the resistive element 115 can be a resistor.

The circuit 100 also includes an output terminal 140 coupled to the output terminal 125. Signal at the output terminal 140 is used to drive a load or an external circuit.

The output terminal 135 of the second amplifier 110 is coupled to the output terminal 140 through the resistive element 115.

In an embodiment, the first reference signal is lower in magnitude than the second reference signal. For example, the first reference signal has a voltage level that is lower when compared to the voltage level of the second reference signal.

The first amplifier 105 is responsive to the first reference signal to supply a first load current to the output terminal 140. The second amplifier 110 is responsive to the second reference signal to supply a second load current to the output terminal 140. The second load current is lower in magnitude than the first load current.

The circuit 100 senses the load condition at the output terminal 140 to determine the load currents to be supplied by the first amplifier 105 and the second amplifier 110. For example, the first amplifier 105 supplies load current, if the load condition sensed is a first load condition and the second amplifier 110 supplies load current for the first load condition and a second load condition. The first load condition can represent operation of the circuit 100 at a full-load condition. The second load condition is the operation of the circuit 100 at low load condition. The full load condition is defined as a state when maximum load current is supplied by the circuit 100. The no-load condition is defined as the state when no load current is supplied by the circuit 100. The load current supplied under low load condition is comparatively lower than the load current supplied under full load conditions. In one embodiment, the first load condition refers to high load current and the second load condition refers to low load current.

In some embodiments, the first load condition is defined as a state when a load current, higher than the threshold, needs to be supplied by the circuit 100. The second load condition, is defined as the state when a load current, lower than the threshold, needs to be supplied by the circuit 100.

In the second load condition, the MOS transistor of the first amplifier 105 operates at low current due to decreasing of the load current of the circuit 100 below the threshold. The low current in the MOS transistor is detected and is used to reduce the quiescent current at which the first amplifier 105 is operated.

In an embodiment, the threshold corresponds to a maximum load current supplied by the second amplifier 110.

During switching from a full load condition to low load condition, variation of output impedance at the output terminal 140 is low due to the presence of the resistive element 115 thus stabilizing the circuit. The resistive element 115 is used to isolate the first amplifier 105 and the second amplifier 110.

Figure 2:
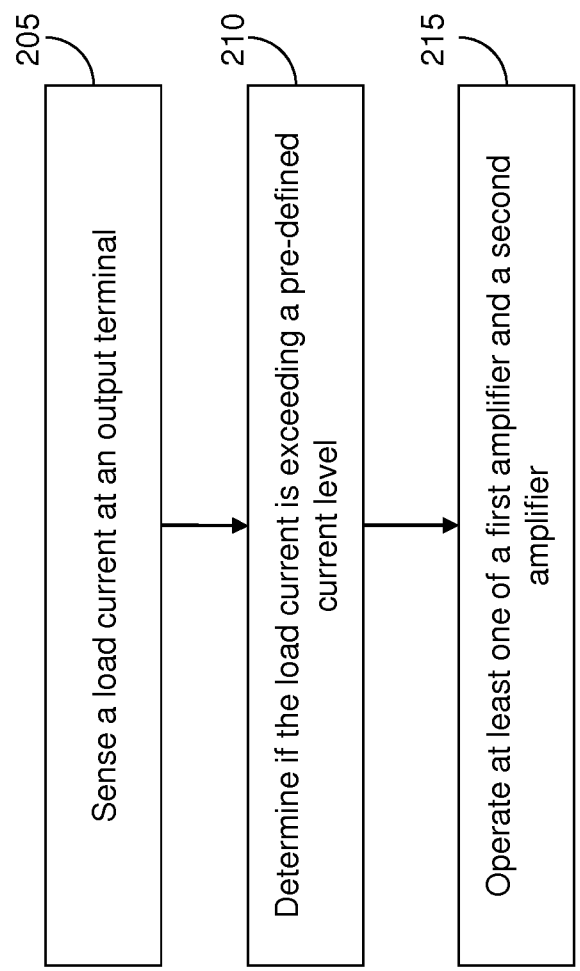
FIG. 2 is a flowchart illustrating a method for optimizing a power management system during varying load conditions.

FIG. 2 is a flowchart illustrating a method for optimizing a power management system during varying load conditions.

A first reference signal is received at an input terminal, herein known as a first input terminal, of a first amplifier. A second reference signal is received at the input terminal, herein known as a second terminal, of a second amplifier. The second reference signal is higher in magnitude in reference to the first reference signal. The first amplifier supplies a first load current and the second amplifier supplies a second load current, the second load current being lower in magnitude than the first load current, to an output terminal of the circuit. The first reference signal and the second reference signal are used to control the operation of the first amplifier and the second amplifier respectively.

At step 205, a load current is sensed at the output terminal. The load current is sensed by a MOS transistor of the first amplifier. The load current is sensed to determine the load currents to be supplied by the first amplifier and the second amplifier.

For example, in a voltage regulator circuit, the actual output voltage of the voltage regulator circuit is compared to some internal reference voltage. Based on the comparison, the load current is supplied to the output terminal so as to reduce the voltage error in the voltage regulator circuit.

At step 210, it is determined if the load current exceeds a pre-defined current level. In one embodiment, the pre-defined current level can be defined as a threshold value that is used to determine operation of at least one of the first amplifier or the second amplifier.

At step 215, at least one of a first amplifier and a second amplifier is operated based on the load current determined.

For the load current exceeding the pre-defined current level, the first amplifier is operated at a first quiescent current and the second amplifier is operated at a second quiescent current. The operation of the first amplifier and the second amplifier is controlled by the first reference signal and the second reference signal respectively.

The second amplifier provides the second load current corresponding to the pre-defined current level. The first amplifier provides the first load current corresponding to the load current exceeding the pre-defined current level.

In an embodiment, the first reference signal and the second reference signal is managed by a tracking circuit that changes the magnitude of the reference signals based on load current required at the output terminal.

In another embodiment, the first reference signal and the second reference signal can be based on a feedback signal that adjusts the load current supplied by the first amplifier and the second amplifier.

For the load current below the pre-defined current level, the second amplifier is operated at the second quiescent current. The MOS transistor of the first amplifier, on sensing the load current is below the pre-defined current level, is operated at a low current. On lowering the current at which the MOS transistor is operated, the quiescent current at which the first amplifier is operated is switched to a third quiescent current. The second amplifier provides the second load current corresponding to the pre-defined current level and the first amplifier stops supply of the first load current. The third quiescent current is lower in magnitude in reference to the first quiescent current. Hence, the power consumption by the first amplifier is reduced.

For example, consider the first reference signal VR1=2V (Volts), the second reference signal VR2=VR1+X=2V+30 mV (milli Volts) and a resistive element having resistance 30 Ohm. If the load current required at the output terminal is more than 1 mA, the second amplifier supplies the second load current of 1 mA (30 mV/30 Ohm). The first amplifier supplies the first load current. Here, the first load current corresponds to a factor by which the required load current is greater than the pre-defined current level.

If the load current at the output terminal is less than 1 mA (30 mV/30 Ohm) then the second amplifier supplies the load current (second load current) 1 mA that corresponds to the load current at the output terminal. The first amplifier does not provide any load current, and the MOS transistor at an output stage of the first amplifier is operated with low current thus reducing the quiescent current level.

In the foregoing discussion, the term "coupled" refers to either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A circuit comprising:
   a first amplifier, the first amplifier responsive to a first reference signal and operable to supply a first load current;
   a second amplifier coupled to the first amplifier, the second amplifier responsive to a second reference signal and operable to supply a second load current, the second load current being lower in magnitude than the first load current, to enable the first amplifier to operate during a first load condition, and the second amplifier to operate during the first load condition and a second load condition;
   a resistive element coupled to the first amplifier and the second amplifier, to isolate the first amplifier from the second amplifier; and,
   an output terminal coupled to the first amplifier and the second amplifier, to output one of the first load current and the second load current.

2. The circuit as claimed in claim 1, wherein the second amplifier is a micropower amplifier.

3. The circuit as claimed in claim 1, wherein the first reference signal has a relatively lower voltage than the second reference signal.

4. The circuit as claimed in claim 1, wherein the first amplifier and the second amplifier are low-dropout regulators.

5. The circuit as claimed in claim 1, wherein the first amplifier comprises a metal oxide semiconductor transistor that becomes inactive if load current is below a threshold.

6. A circuit comprising:
   a first amplifier, the first amplifier responsive to a first reference signal and operable to supply a first load current;
   a second amplifier coupled to the first amplifier, the second amplifier responsive to a second reference signal and operable to supply a second load current, the second load current being lower in magnitude than the first load current, thereby enabling the first amplifier to operate during a first load condition, and the second amplifier to operate during the first load condition and a second load condition; and
   a resistive element coupled to the first amplifier and the second amplifier, to isolate the first amplifier from the second amplifier.

7. The circuit as claimed in claim 6 further comprising: an output terminal coupled to the first amplifier and the second amplifier, to output the first load current and the second load current.

8. The circuit as claimed in claim 6, wherein the second amplifier is a micropower amplifier.

9. The circuit as claimed in claim 6, wherein the first reference signal has a relatively lower voltage than the second reference signal.

10. The circuit as claimed in claim 6, wherein the first amplifier and the second amplifier are low-dropout regulators.

11. The circuit as claimed in claim 6, wherein the first amplifier comprises a metal oxide semiconductor transistor that becomes inactive if load current is below a threshold.

* * * * *